(12) United States Patent
Nomura et al.

(10) Patent No.: US 11,114,368 B2
(45) Date of Patent: Sep. 7, 2021

(54) BASE MATERIAL, MOLD PACKAGE, BASE MATERIAL MANUFACTURING METHOD, AND MOLD PACKAGE MANUFACTURING METHOD

(71) Applicant: DENSO CORPORATION, Kariya (JP)

(72) Inventors: Takumi Nomura, Kariya (JP); Wataru Kobayashi, Kariya (JP); Kazuki Koda, Kariya (JP)

(73) Assignee: DENSO CORPORATION, Kariya (JP)

( * ) Notice: Subject to any disclaimer, the term of this patent is extended or adjusted under 35 U.S.C. 154(b) by 99 days.

(21) Appl. No.: 16/596,897

(22) Filed: Oct. 9, 2019

(65) Prior Publication Data

US 2020/0043835 A1 Feb. 6, 2020

Related U.S. Application Data

(63) Continuation of application No. PCT/JP2018/009056, filed on Mar. 8, 2018.

(30) Foreign Application Priority Data

Apr. 14, 2017 (JP) .............................. JP2017-080679

(51) Int. Cl.
| | |
|---|---|
| *H01L 23/495* | (2006.01) |
| *H01L 21/48* | (2006.01) |
| *H01L 21/56* | (2006.01) |
| *H01L 23/29* | (2006.01) |
| *H01L 23/31* | (2006.01) |
| *H01L 23/00* | (2006.01) |

(52) U.S. Cl.
CPC .... *H01L 23/49513* (2013.01); *H01L 21/4821* (2013.01); *H01L 21/565* (2013.01); *H01L 23/293* (2013.01); *H01L 23/3121* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48106* (2013.01); *H01L 2224/48175* (2013.01); *H01L 2224/73265* (2013.01)

(58) Field of Classification Search
CPC .................................................. H01L 23/49513
USPC ........................................................ 257/676
See application file for complete search history.

(56) References Cited

U.S. PATENT DOCUMENTS

| | | | |
|---|---|---|---|
| 10,211,131 B1* | 2/2019 | Kitnarong | ............. H01L 21/563 |
| 2006/0231931 A1 | 10/2006 | Kang et al. | |
| 2008/0001264 A1* | 1/2008 | Lange | ............... H01L 23/49503 257/666 |
| 2016/0207148 A1 | 7/2016 | Kobayashi et al. | |
| 2017/0278774 A1 | 9/2017 | Hayashi et al. | |

FOREIGN PATENT DOCUMENTS

| | | |
|---|---|---|
| JP | H08-32006 A | 2/1996 |
| JP | 2002-280512 A | 9/2002 |
| JP | 4595505 B2 | 6/2006 |

(Continued)

*Primary Examiner* — Ajay Arora
(74) *Attorney, Agent, or Firm* — Posz Law Group, PLC

(57) ABSTRACT

A base material includes one surface, and a side surface continuous with the one surface. Each of the one surface and the side surface has a sealed region to be sealed with mold resin. The one surface has a one surface rough region in the sealed region thereof. The side surface has a side surface rough region in the sealed region thereof.

15 Claims, 9 Drawing Sheets

(56) References Cited

FOREIGN PATENT DOCUMENTS

| | | |
|---|---|---|
| JP | 4609172 B2 | 11/2006 |
| JP | 2007-258205 A | 10/2007 |
| JP | 2014-93425 A | 5/2014 |
| JP | 2016-105432 A | 6/2016 |
| JP | 2016-167543 A | 9/2016 |

\* cited by examiner

BASE MATERIAL, MOLD PACKAGE, BASE MATERIAL MANUFACTURING METHOD, AND MOLD PACKAGE MANUFACTURING METHOD

CROSS REFERENCE TO RELATED APPLICATIONS

The present application is a continuation application of International Patent Application No. PCT/JP2018/009056 filed on Mar. 8, 2018, which designated the U.S. and claims the benefit of priority from Japanese Patent Application No. 2017-080679 filed on Apr. 14, 2017. The entire disclosures of all of the above applications are incorporated herein by reference.

TECHNICAL FIELD

The present disclosure relates to a base material, a mold package having a base material, a method for manufacturing a base material, and a method for manufacturing a mold package.

BACKGROUND

A semiconductor device which includes a semiconductor chip or the like mounted on one surface of a base material has been proposed. In such a semiconductor device, a base material has a rough region with a rough shape in one surface of the base material at a region different from a region where a semiconductor chip is mounted. In addition, a mold resin is disposed on the one surface of the base material to cover the semiconductor chip.

SUMMARY

The present disclosure describes a base material, a mold package having a base material, a method for manufacturing a base material, and a method for manufacturing a mold package. The base material has one surface and a side surface each having a sealed region to be sealed with a mold resin. Each of the one surface and the side surface has a rough region in the sealed region thereof, the rough region being provided by a plurality of metal particles stacked on one another.

DETAILED DESCRIPTION

Figure 1:
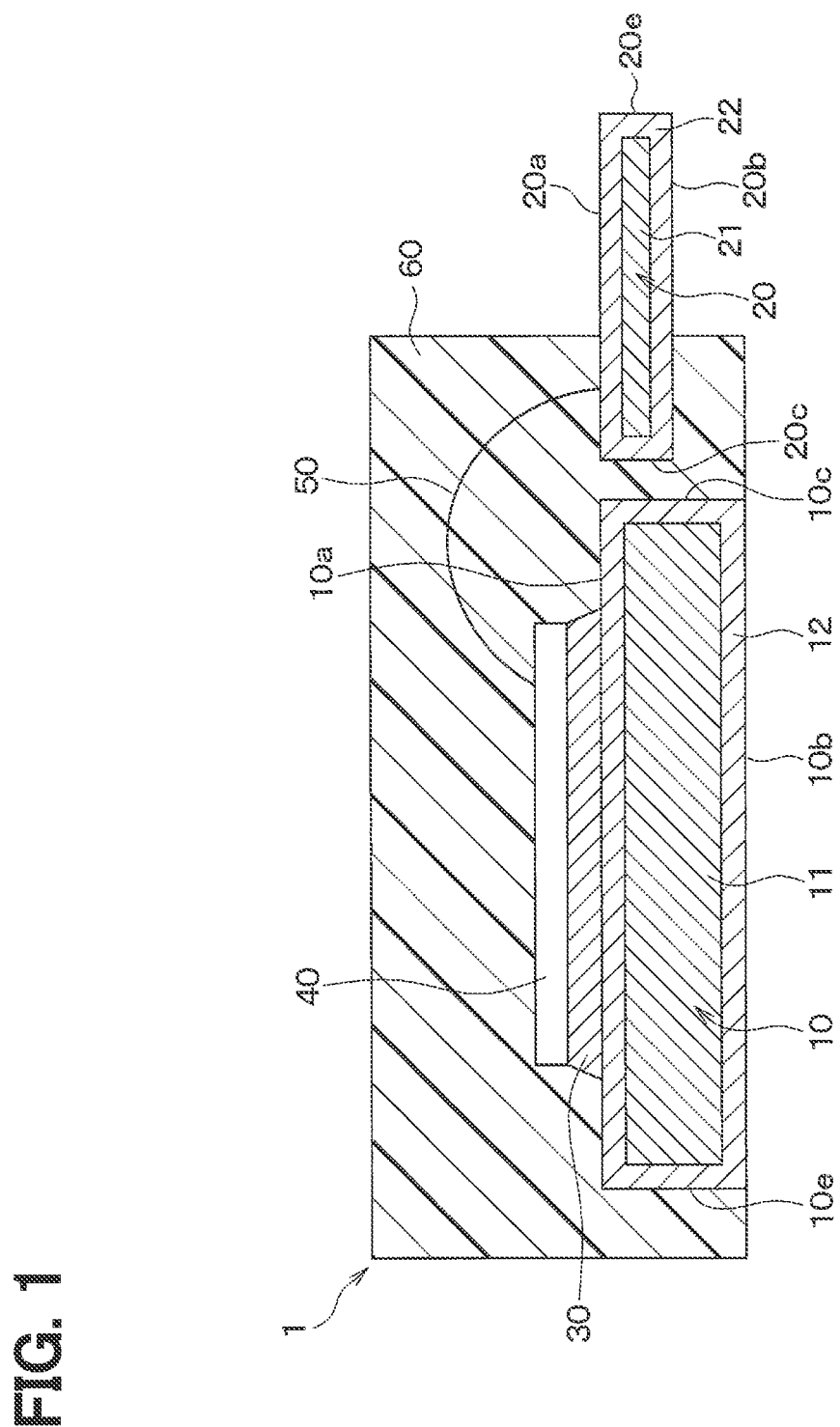
FIG. 1 is a diagram illustrating a cross-sectional view of a mold package according to a first embodiment.

In a semiconductor device, a base material may have a rough region in one surface to improve adhesiveness between the one surface of the base material and a mold resin, and to reduce separation of the mold resin from the one surface of the base material.

When the base material is sealed with the mold resin, side surfaces of the base material may also be sealed with the mold resin. In such a case, if the side surfaces of the base material is not formed with the rough region, the mold resin may be separated from the side surfaces.

According to an aspect of the present disclosure, a base material has one surface and a side surface continuous with the one surface and, each of the one surface and the side surface has a sealed region to be sealed with a mold resin. In the base material, the one surface has a one surface rough region having a rough shape in a region corresponding to the sealed region, and the side surface has a side surface rough region having a rough shape in a region corresponding to the sealed region. Each of the one surface rough region and the side surface rough region is provided by a plurality of metal particles stacked on one another.

According to this aspect, the one surface has the one surface rough region and the side surface has the side surface rough region. As such, after the base material is sealed with the mold resin, separation of the mold resin from the one surface and the side surface can be reduced.

According to another aspect of the present disclosure, the plurality of metal particles are stacked in a state where voids are formed between the adjoining metal particles. The voids are connected with each other and are communicated with a space outside a region where the metal particles are stacked.

According to this aspect, the mold resin can be introduced into the voids during sealing with a resin to form the mold resin. Accordingly, adhesiveness of the base material with the mold resin improves, and hence separation of the mold resin can be further reduced.

According to further another aspect of the present disclosure, a mold package includes a mounting portion and a terminal portion, and the mounting portion and the terminal portion are both sealed with a mold resin. The mold package includes: the mounting portion having one surface, and a side surface continuous with the one surface; the terminal portion having one surface and a side surface continuous with the one surface; a semiconductor chip mounted on the one surface of the mounting portion; a connection member electrically connecting the semiconductor chip and the terminal portion; and the mold resin sealing the one surface and the side surface of the mounting portion, and the one surface and the side surface of the terminal portion while sealing the semiconductor chip and the connection member. Each of the mounting portion and the terminal portion includes a one surface rough region having a rough shape in a sealed region of the one surface to be sealed with the mold resin, and a side surface rough region having a rough shape in a sealed region of the side surface to be sealed with the mold resin. Each of the one surface rough region and the side surface rough region is provided by a plurality of metal particles stacked on one another.

According to this aspect, each of the mounting portion and the terminal portion includes the one surface rough region in the one surface, and also the side surface rough region in the side surface. As such, separation of the mold resin from the one surface and the side surface of each of the mounting portion and the terminal portion of the mold package can be reduced.

A still another aspect of the present disclosure is directed to a method for manufacturing a base material that includes one surface, and a side surface continuous with the one surface, and in which each of the one surface and the side surface has a sealed region to be sealed with a mold resin. The method includes: preparing a base member that has the one surface and the side surface, and is made of a metal material; forming a one surface rough region that has a rough shape in a region corresponding to the sealed region of the one surface; and forming a side surface rough region that has a rough shape in a region corresponding to the sealed region of the side surface. In the forming of the one surface rough region and the forming of the side surface rough region, a groove is formed in the one surface so as to float the metal particles, so that the floated metal particles are deposited and stacked in the groove and in a region around the groove in the one surface, and also deposited and stacked on the side surface, to thereby form the one surface rough region and the side surface rough region.

According to this aspect, the side surface rough region is formed in the side surface by forming the groove in the one surface. Thus, it is not necessary to perform special processing on the side surface. Accordingly, the side surface rough region can be formed on the side surface while simplifying a manufacturing process.

A yet another aspect of the present disclosure is directed to a method for manufacturing a base material that has one surface, and a side surface continuous with the one surface, and in which each of the one surface and the side surface has a sealed region to be sealed with a mold resin. The method includes: preparing a base member that has the one surface and the side surface; forming a one surface rough region having a rough shape in a region corresponding to the sealed region in the one surface; and forming a side surface rough region having a rough shape in a region corresponding to the sealed region in the side surface. In the forming of the one surface rough region and the forming of the side surface rough region, a target member made of a metal material is prepared, and metal particles are floated from the target member so that the floated metal particles are deposited and stacked on the one surface and the side surface, to thereby form the one surface rough region and the side surface rough region.

According to this aspect, each of the rough regions is formed by preparing the target member, and depositing the metal particles floated from the target member. In this case, the metal particles forming each of the rough regions can be changed by changing a material forming the target member. Accordingly, each of the rough regions can be formed by using metal particles corresponding to purposes of use, hence the degree of freedom in design can improve.

A yet another aspect of the present disclosure is directed to a method for manufacturing a mold package in which a base material is sealed with a mold resin. The method includes: preparing the base material manufactured by the above-described method for manufacturing the base material; and forming the mold resin such that the one surface and the side surface of the base material are sealed. In the forming of the mold resin, a resin is introduced into the voids.

According to this aspect, the mold resin is introduced into the voids formed between the stacked metal particles. Accordingly, the mold package having higher adhesiveness between the base material and the mold resin can be manufactured.

Embodiments according to the present disclosure are hereinafter described with reference to the drawings. In the respective embodiments described herein, identical or equivalent parts are given identical reference numbers.

First Embodiment

A first embodiment will be described with reference to the drawings. A configuration of a mold package of the present embodiment will be initially described. As shown in FIG. 1, a mold package 1 includes a mounting portion 10, and a plurality of terminal portions 20 disposed around the mounting portion 10. FIG. 1 shows only one of the plurality of terminal portions 20.

In the present embodiment, the mounting portion 10 and the terminal portions 20 are produced by preparing a not-shown lead frame which includes the mounting portion 10 and the terminal portions 20 integral through a tie bar, an outer peripheral frame, or the like, and removing the tie bar, the outer peripheral frame, or the like in an appropriate manner to separate the mounting portion 10 and the terminal portions 20. Namely, the mounting portion 10 and the terminal portions 20 are produced from a common lead frame.

In the present embodiment, the mounting portion 10 includes a main metal portion 11 made of a metal material, and a metal thin film 12 covering the main metal portion 11. Similarly, the terminal portion 20 includes a main metal portion 21 made of a metal material, and a metal thin film 22 covering the main metal portion 21.

For example, each of the main metal portions 11 and 21 is made of a metal material such as Cu (copper), Al (aluminum), an Al alloy, Fe (iron), and an Fe-based alloy. Each of the metal thin films 12 and 22 is a plating film, and is made of a metal material such as Ni (nickel), Pd (palladium), Ag (silver), and Au (gold). In the present embodiment, each of the metal thin films 12 and 22 is made of a Ni plating film.

Figure 7:
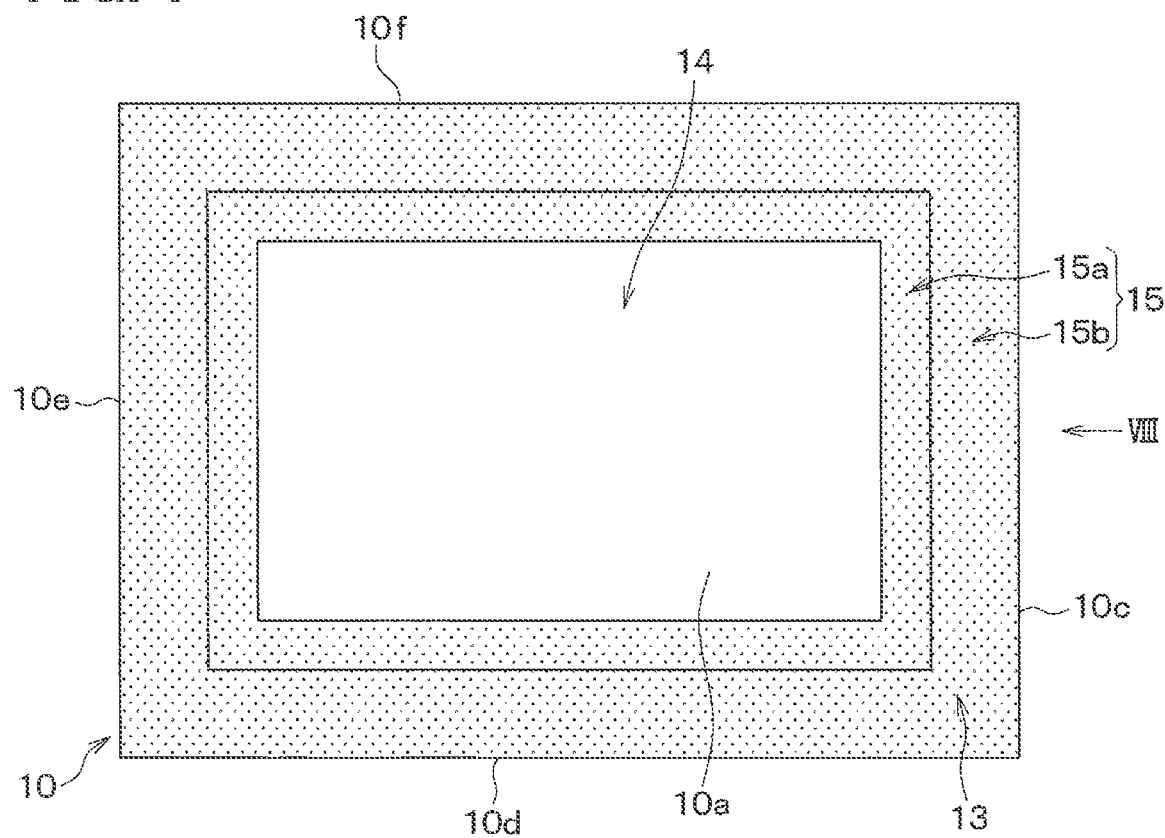
FIG. 7 is a diagram for explaining respective regions in one surface of a mounting portion shown in FIG. 1.

The mounting portion 10 has a plate shape, and includes one surface 10a, an opposite surface 10b disposed opposite to the one surface 10a, and four side surfaces 10c to 10f connecting the one surface 10a and the opposite surface 10b. FIG. 1 shows only the side surfaces 10c and 10e of the side surfaces 10c to 10f. The side surfaces 10d and 10f are side surfaces connecting the side surface 10c and the side surface 10e as shown in FIG. 7 described below. As described above, the mounting portion 10 is configured such that the main metal portion 11 is covered with the metal thin film 12. Accordingly, the respective surfaces 10a to 10f of the mounting portion 10 are provided by surfaces of the metal thin film 12 on the side opposite to the main metal portion 11.

A semiconductor chip 40 is mounted on the one surface 10a of the mounting portion 10 with a bonding member 30 interposed therebetween. For example, the semiconductor chip 40 includes a silicon substrate, and a diode element, a metal oxide semiconductor field effect transistor (MOSFET) element, and the like provided on the silicon substrate. For example, the bonding member 30 is provided by Ag paste or solder.

Figure 2:
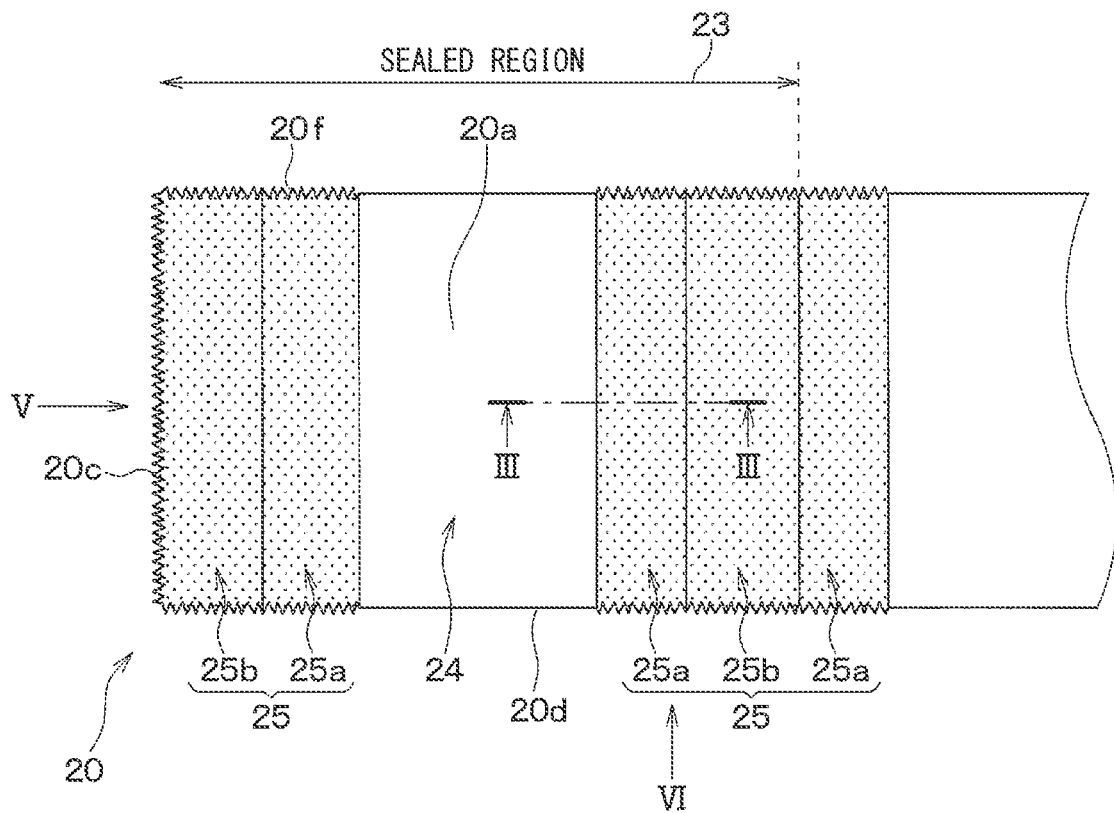
FIG. 2 is a diagram for explaining respective regions in one surface of a terminal portion shown in FIG. 1.

The terminal portion 20 has a plate shape, and includes one surface 20a, an opposite surface 20b disposed opposite to the one surface 20a, and four side surfaces 20c to 20f connecting the one surface 20a and the opposite surface 20b. The plurality of terminal portions 20 are disposed around the mounting portion 10 such that the one surfaces 20a are substantially parallel to the one surface 10a of the mounting portion 10. FIG. 1 only shows the front side surface 20c and the rear side surface 20e of the side surfaces 20c to 20f. The front side surface 20c is adjacent to the mounting portion 10, while the rear side surface 20e is on the side opposite to the mounting portion 10. The side surfaces 20d and 20f are lateral side surfaces 20d and 20f connecting the front side surface 20c and the rear side surface 20e as shown in FIG. 2 described below. As described above, the terminal portion 20 is configured that the main metal portion 21 is covered with the metal thin film 22. Accordingly, the respective surfaces 20a to 20f of the terminal portion 20 are provided by surfaces of the metal thin film 22 on the side opposite to the main metal portion 21.

The one surface 20a of the terminal portion 20 is electrically connected to the semiconductor chip 40 via a bonding wire 50 at a position adjacent to the mounting portion 10. For example, the bonding wire 50 is made of an Al wire, an Au wire, a Cu wire, or the like. In the present embodiment, the bonding wire 50 corresponds to a connection member.

A mold resin 60 is disposed in such a manner as to seal the one surface 10a and the respective side surfaces 10c to 10f of the mounting portion 10, and the respective surfaces 20a to 20d and 20f of the terminal portion 20 adjacent to the mounting portion 10 while sealing the semiconductor chip 40 and the bonding wire 50.

In the present embodiment, the mold resin 60 is made of an epoxy resin. FIG. 1 shows a state that the opposite surface 10b of the mounting portion 10 is exposed from the mold resin 60. However, the opposite surface 10b of the mounting portion 10 may also be sealed with the mold resin 60.

The mold package 1 of the present embodiment has the basic configuration described above. According to the present embodiment, each of the mounting portion 10 and the terminal portion 20 has a rough region having a rough shape with protrusions and recessions in a sealed region to be sealed with the mold resin 60. The rough region of the terminal portion 20 will be initially described with reference to FIGS. 2 to 6. In the following description, a region of the terminal portion 20 sealed by the mold resin 60 is referred to as a sealed region 23.

As shown in FIGS. 1 and 2, the terminal portion 20 has the sealed region 23 in a region adjacent to the mounting portion 10. As shown in FIG. 2, the terminal portion 20 has a wire region 24 to which the bonding wire 50 is connected in the sealed region 23 of the one surface 20a. The terminal portion 20 further includes one surface rough regions 25 in a region of the sealed region 23 of the one surface 20a different from the wire region 24. Each of the one surface rough regions 25 has a rough shape with protrusions and recesses. In the present embodiment, the wire region 24 corresponds to a connection region.

Specifically, the terminal portion 20 has a plate shape which has a longitudinal direction in a direction from the front side surface 20c to the rear side surface 20e. In FIG. 2, the longitudinal direction corresponds to the left-right direction in the figure. In the sealing region 23 of the one surface 20a, the one surface rough region 25, the wire region 24, and the one surface rough region 25 are arranged in this order in the longitudinal direction from the front side surface 20c. Namely, the two one surface rough regions 25 are positioned on opposite sides of the wire region 24 in the sealed region 23 of the one surface 20a.

Each of the one surface rough regions 25 has a first rough region 25a adjacent to the wire region 24, and a second rough region 25b on the side opposite to the wire region 24 with respect to the first rough region 25a. The one surface rough region 25, which is one of the two one surface rough regions 25 and located on the side opposite to the front side surface 20c, further has the first rough region 25a also on the side opposite to the wire region 24 with respect to the first rough region 25a adjacent to the wire region 24 and the second rough region 25b. According to the present embodiment, the sealed region 23 of the one surface 20a is provided by a region extending from the front side surface 20c to the second rough region 25b of the one surface rough region 25 located on the side opposite to the front side surface 20c. Namely, the first rough region 25a located farthest from the front side surface 20c is not included in the sealed region 23. However, the sealed region 23 may include the entirety of the one surface rough region 25 located on the side opposite to the front side surface 20c.

Figure 3:
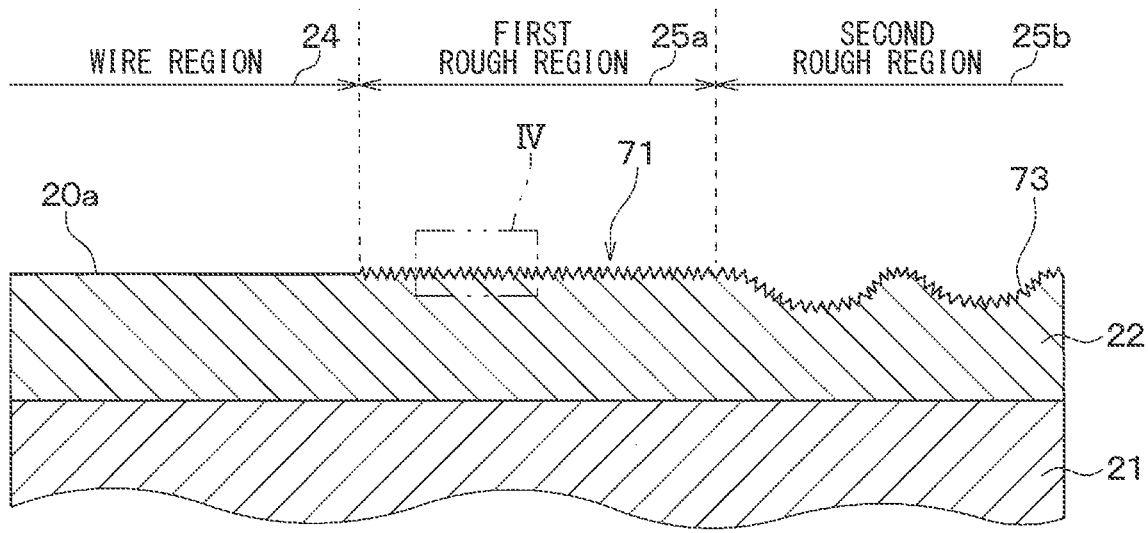
FIG. 3 is a diagram illustrating a cross-sectional view taken along a line III-III in FIG. 2.
Figure 4:
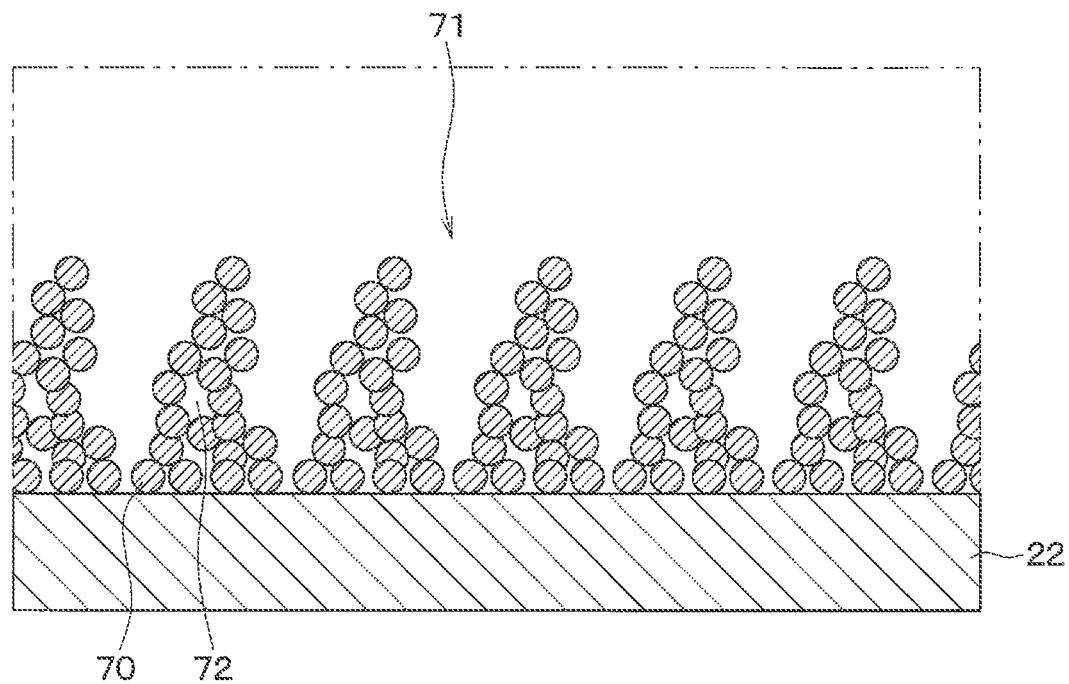
FIG. 4 is a diagram illustrating an enlarged view of a region IV in FIG. 3.

As shown in FIGS. 3 and 4, the first rough region 25a has a rough shape provided by a minute protrusion and recess portion 71. The minute protrusion and recess portion 71 is provided by a plurality of metal particles 70 that are stacked on one another on the metal thin film 22. Specifically, as shown in FIG. 4, the minute protrusion and recess portion 71 of the present embodiment is provided by a stack of metal particles 70 that are stacked into a shape tapered off in a direction away from the metal thin film 22. Accordingly, in the present embodiment, the minute protrusion and recess portion 71 is formed of the plurality of metal particles 70 stacked into protrusions. In the minute protrusion and recess portion 71, voids 72 are formed between the adjoining metal particles 70.

The voids 72 are formed in such a state that spaces between the adjoining metal particles 70 are connected with each other, and are communicated with a space outside the region where the metal particles 70 are stacked. In the present embodiment, the metal particles 70 are stacked in a protruded shape. Accordingly, each of the voids 72 is considered to be connected with a recess formed between the adjoining protrusions, for example. The size of each of the voids 72, in a cross section defined in a direction perpendicular to the one surface 20a, is approximately in a range from several nanometers to 100 nm. According to the present embodiment, the mold resin 60 is made of an epoxy resin, and in which a distance between ends of molecules in a molten state is approximately 3 nm to 10 nm. Accordingly, it is considered that the metal particles 70 are stacked in such a manner as to form the voids 72 so as to allow a molten resin for forming the mold resin 60 to introduce into the voids 72. While not particularly shown in the figures, the mold resin 60 is in a state of being introduced in voids 72. According to the present embodiment, it is assumed that the minute protrusion and recess portion 71 has a maximum height of 300 nm or smaller. In other words, the maximum length between the portion of the minute protrusion and recess portion 71 farthest from the metal thin film 22 and the metal thin film 22 is 300 nm or smaller.

According to the present embodiment, each of the metal particles 70 is made of an oxide of the same material as the material of the metal thin film 22. Namely, in the present embodiment, since the plated film is made of Ni, the minute protrusion and recess portion 71 is provided by the stack of metal particles 70 made of a Ni oxide.

As shown in FIG. 3, the second rough region 25b has a rough shape in which the metal thin film 22 has a plurality of grooves 73 each having a size of approximately several micrometers, and the above-described minute protrusion and recess portion 71 is formed on an upper part of the metal thin film 22 including an upper part of the grooves 73. Namely, the second rough region 25b includes the grooves 73, which are not formed in the first rough region 25a. Thus, the second rough region 25b has a rough shape having a larger height difference than that of the first rough region 25a.

The one surface 20a of the terminal portion 20 has the configuration described above. The region including the minute protrusion and recess portion 71 has the voids 72 within the minute protrusion and recess portion 71 as described above. Thus, the region where the minute protrusion and recess portion 71 is formed is considered as a porous region.

Figure 5:
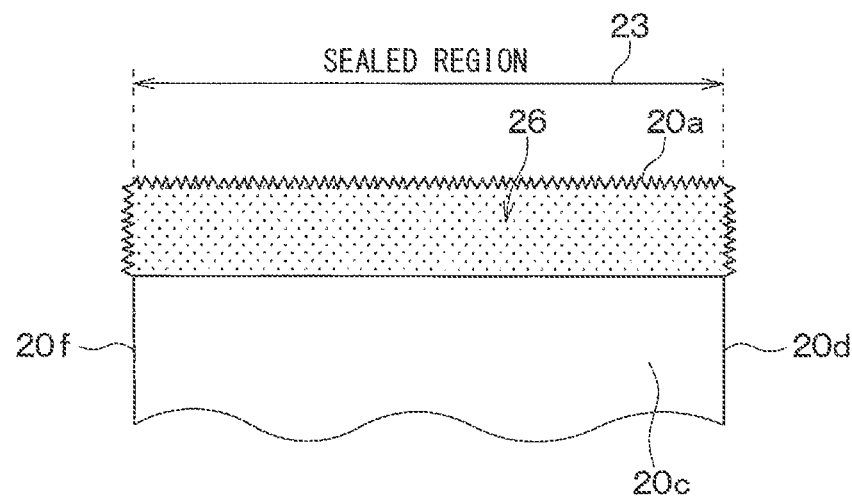
FIG. 5 is a diagram illustrating a plan view viewed in a direction along an arrow V in FIG. 2.

As shown in FIG. 1, the entirety of the front side surface 20c of the terminal portion 20 corresponds to the sealed region 23. As shown in FIG. 5, a region of the front side surface 20c adjacent to the one surface 20a corresponds to a front side surface rough region 26. Namely, the region of the front side surface 20c connecting to the second rough region 25b corresponds to the front side surface rough region 26. The front side surface rough region 26 has a substantially uniform length between the lateral side surface 20d and the lateral side surface 20f to the farthest portion from the one surface 20a. The front side surface rough region 26 has a configuration similar to the configuration of the first rough region 25a, and has a rough shape provided by the stack of plural metal particles 70.

Figure 6:
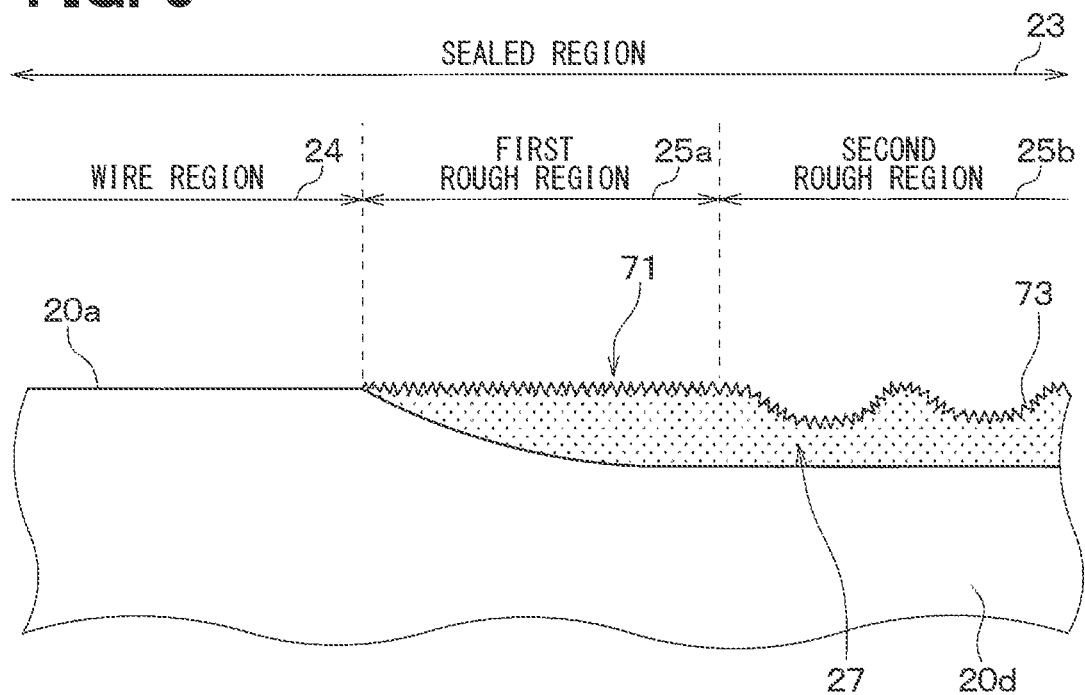
FIG. 6 is a diagram illustrating a plan view viewed in a direction along an arrow VI in FIG. 2.

As shown in FIG. 1, a region of each of the lateral side surfaces 20d and 20f of the terminal portion 20 adjacent to the mounting portion 10 corresponds to the sealed region 23. As shown in FIG. 6, the sealed region 23 of the lateral side surface 20d has a lateral side surface rough region 27 in a region adjacent to the one surface 20a. Specifically, the lateral side surface rough region 27 is formed in a region of the lateral side surface 20d adjacent to the one surface 20a and continuous with the first rough region 25a and the second rough region 25b. The lateral side surface rough region 27 is shaped such that a length to the farthest portion from the one surface 20a decreases in a direction away from the second rough region 25b, from the region connected to the second rough region 25b. Namely, the lateral side surface rough region 27 is shaped such that the length to the farthest portion from the one surface 20a decreases with a distance from the second rough region 25b in the region connected to the first rough region 25a.

The lateral side surface rough region 27 has a configuration similar to the configuration of the first rough region 25a, and has a rough shape provided by the stack of plural metal particles 70. The region of the lateral side surface 20d connected to the first rough region 25a is also considered as a region of the lateral side surface 20d immediately below the first rough region 25a. Similarly, the region of the lateral side surface 20d connected to the second rough region 25b is also considered as a region of the lateral side surface 20d located immediately below the second rough region 25b. While not particularly shown in the figures, the lateral side surface 20f has the lateral side surface rough region 27 adjacent to the one surface 20a, similarly to the lateral side surface 20d.

The terminal portion 20 has the configuration described above. A plurality of dots representing the rough shape are given to each of the one surface rough regions 25 in FIG. 2, the front side surface rough region 26 in FIG. 5, and the lateral side surface rough region 27 in FIG. 6 for easy understanding. A configuration of the mounting portion 10 will be next described. It is assumed in the following description that a region of the mounting portion 10 sealed with the mold resin 60 corresponds to a sealed region 13.

As shown in FIG. 7, the one surface 10a of the mounting portion 10 has a mounting region 14 at a substantially central portion, and a one surface rough region 15 on a periphery surrounding the mounting region 14. The one surface rough region 15 has a rough shape with protrusions and recesses. The mounting region 14 is a region where the semiconductor chip 40 is disposed with the bonding member 30 interposed therebetween. As shown in FIG. 1, in the one surface 10a of the mounting portion 10, the one surface rough region 15 corresponds to the sealed region 13 sealed with the mold resin 60.

The one surface rough region 15 includes a first rough region 15a adjacent to the mounting region 14, and a second rough region 15b on the side opposite to the mounting region 14 with respect to the first rough region 15a. Similarly to the first rough region 25a of the terminal portion 20, the first rough region 15a has a rough shape provided by the plurality of metal particles 70 that are stacked on one another to form the minute protrusion and recess portion 71. Similarly to the second rough region 25b of the terminal portion 20, the second rough region 15b has a plurality of the grooves 73, and has a rough shape which includes the minute protrusion and recess portion 71 formed on the upper part of the metal thin film 12 including the upper part of the grooves 73.

Figure 8:
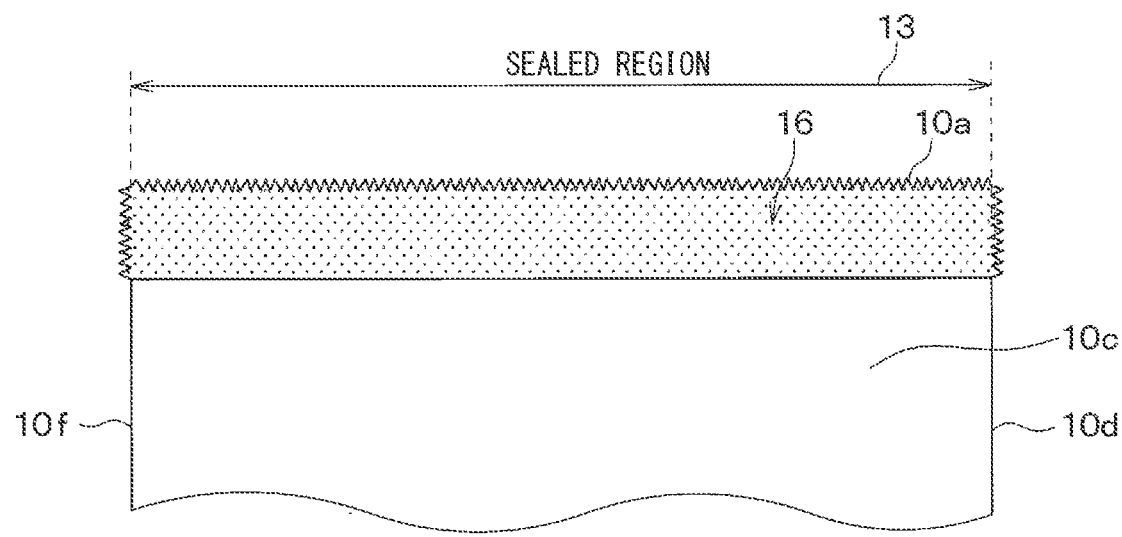
FIG. 8 is a diagram illustrating a plan view viewed in a direction along an arrow VIII in FIG. 7.

As shown in FIG. 1, the entirety of each of the side surfaces 10c to 10f of the mounting portion 10 corresponds to the sealed region 13. As shown in FIG. 8, a region of the side surface 10c adjacent to the one surface 20a corresponds to a side surface rough region 16. Similarly to the first rough region 15a, the side surface rough region 16 has a rough shape provided by the plurality of metal particles 70 that are stacked on one another to form the minute protrusion and recess portion 71. The side surface rough region 16 has a substantially uniform length between the side surface 10d and the side surface 10f to the farthest portion from the one surface 10a. While not particularly shown in the figures, a region of each of the other side surfaces 10d, 10e, and 10f adjacent to the one surface 10a corresponds to the side surface rough region 16 similarly to the side surface 10c. A plurality of dots representing the rough shape are given to each of the one surface rough region 15 in FIG. 7, and the side surface rough region 16 in FIG. 8 for easy understanding.

The mold package 1 of the present embodiment has the configuration described above. A method for manufacturing the mold package 1 according to the present embodiment will be next described with reference to FIGS. 9 and 10.

Figure 9:
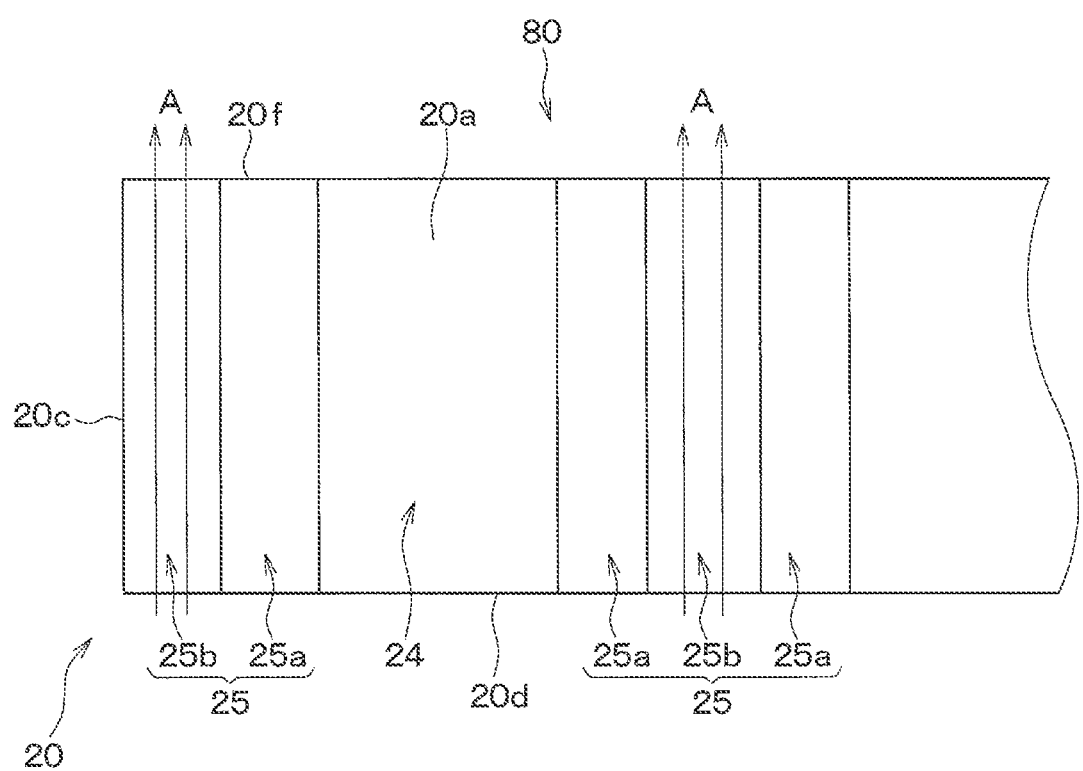
FIG. 9 is a diagram illustrating a region of the terminal portion to which a laser light is applied.
Figure 10:
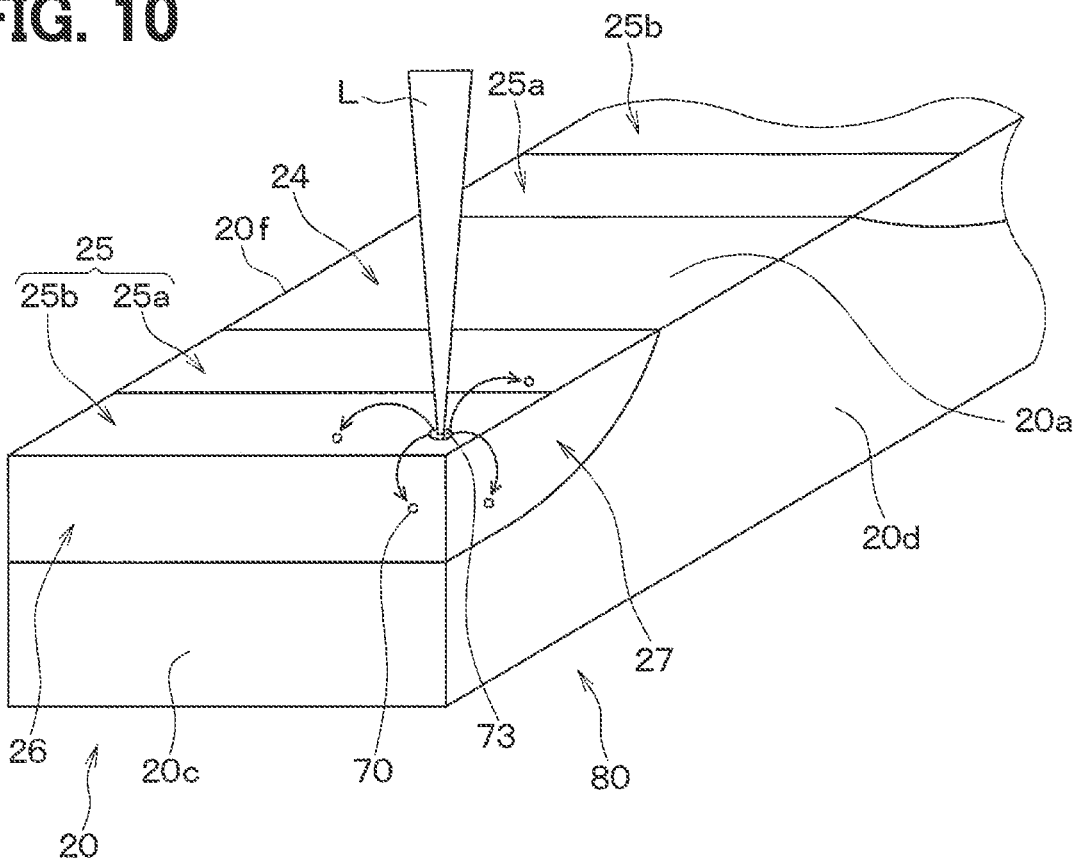
FIG. 10 is a schematic diagram illustrating a state when the laser light is applied to the terminal portion.

As shown in FIGS. 9 and 10, a lead frame 80 which includes the mounting portion 10 and the terminal portion 20 integral with each other through a tie bar, an outer peripheral frame, or the like is initially prepared. FIGS. 9 and 10 show only the one terminal portion 20 in the lead frame 80. According to the present embodiment, the lead frame 80 corresponds to a base member.

Then, the one surface rough region 15 and the side surface rough region 16 are formed in the mounting portion 10. The one surface rough region 25, the front side surface rough region 26, and the lateral side surface rough region 27 are formed in the terminal portion 20. A process for forming the one surface rough region 25, the front side surface rough region 26, and the lateral side surface rough region 27 in the terminal portion 20 will be hereinafter specifically described. A process for forming the one surface rough region 15 and the side surface rough region 16 in the mounting portion 10 is similar to the process for forming the one surface rough region 25, the front side surface rough region 26, and the lateral side surface rough region 27 in the terminal portion 20.

According to the present embodiment, a light source which oscillates laser light L, a condensing lens, and others are appropriately disposed, and the laser light L is applied to a region which will become the second rough region 25b of the terminal portion 20. When the laser light L is applied to the second rough region 25b in the present embodiment, for example, the laser light L is applied to a plurality of positions in a direction orthogonal to the longitudinal direction of the terminal portion 20 as indicated by arrows A in FIG. 9. At this time, for example, the light source is moved relative to the second rough region 25b by scanning a table carrying the terminal portion 20 or by scanning the light source to apply the laser light L to a plurality of positions along the arrows A. The laser light L may be applied using a so-called Galvano scanner which performs scanning with the laser light L by rotating a mirror disposed near the light source.

In this case, as shown in FIG. 10, in the region receiving the laser light L, the metal particles 70 are floated and the grooves 73 each having a size of approximately several micrometers are formed. The floating metal particles 70 are deposited around the region receiving the laser light L. As a result, the floating metal particles 70 are stacked to form the minute protrusion and recess portion 71. At this time, the floating metal particles 70 are also deposited in a region around the region receiving the laser light L. Accordingly, the plurality of metal particles 70 are stacked at positions in the one surface 20a adjacent to the second rough region 25b to form the first rough region 25a. Moreover, the plurality of metal particles 70 are stacked on a region of each of the front side surface 20c, the lateral side surface 20d, and the lateral side surface 20f adjacent to the one surface 20a and adjacent to the second rough region 25b to form each of the front side surface rough region 26 and the lateral side surface rough region 27. Since the rough shape is formed in this manner in each of the front side surface 20c and the lateral side surfaces 20d and 20f, it is not necessary to perform a special processing onto the respective side surfaces 20c, 20d and 20f. Thus, the manufacturing process can be simplified.

As described above, the metal particles 70 are stacked in such a manner as to form the voids 72. The adhesion of the metal particles 70 to the lateral side surfaces 20d and 20f reduces with a distance from the second rough region 25b. Accordingly, as shown in FIG. 6, a length of the lateral side surface rough region 27 to the farthest portion from the one surface 20a decreases with a distance from the region connected to the second rough region 25b.

It is preferable that the laser light L be applied under such conditions that the scattering metal particles 70 do not contaminate a manufacturing apparatus by adhering to the manufacturing apparatus, for example. For example, when the metal thin film 22 is made of an Ni plating film as in the present embodiment, the laser light L is applied under conditions of energy density of 300 J/cm$^2$ or lower, a pulse width of 1 μm second or shorter, and a surface temperature of approximately 1500° C. of the metal thin film 22.

According to the present embodiment, the metal thin film 22 is provided by a Ni plating film. Thus, when the laser light L is applied under the above conditions, the metal particles 70 are deposited into a shape tapered off from the metal thin film 22 toward the side opposite to the metal thin film 22 as shown in FIG. 4. A clear principle has not been revealed in this point. It is estimated, however, that this tapered shape is produced based on a difficulty of rearrangement due to low energy of the metal particles 70 at the time of deposition of the floating metal particles 70.

In the manner described above, the one surface rough region 25, the front side surface rough region 26, and the lateral side surface rough region 27 are formed in the terminal portion 20.

While not particularly shown in the figures, the laser light L is also applied to the second rough region 15b of the mounting portion 10. As a result, the grooves 73 are formed in the second rough region 15b, and the metal particles 70 are stacked to form a rough shape. Moreover, the first rough region 15a is formed by the metal particles 70 stacked around the second rough region 15b of the one surface 10a. The metal particles 70 are stacked in a region of each of the side surfaces 10c to 10f adjacent to the one surface 10a adjoining o the second rough region 15b to form the side surface rough region 16.

Next, the semiconductor chip 40 is mounted on the mounting region 14 of the mounting portion 10 with the bonding member 30 interposed therebetween. Thereafter, wire bonding is performed to bond the semiconductor chip 40 and the terminal portion 20. Wire bonding is performed for the wire region 24 of the terminal portion 20.

Subsequently, the product obtained by the above steps is placed in a not-shown metal mold. A molten resin for forming the mold resin 60 is injected into the metal mold and solidified. In this case, the molten resin is introduced and solidified in the voids 72 each having a size sufficient for introducing the molten resin. Thereafter, the outer peripheral frame and the like are appropriately removed, and hence the mold package described above is produced.

According to the present embodiment described above, the mounting portion 10 has the one surface rough region 15 in the one surface 10a, and also the side surface rough regions 16 in the side surfaces 10c to 10f. Accordingly, separation of the mold resin 60 from the side surfaces 10c to 10f of the mounting portion 10 can be reduced. Similarly, the terminal portion 20 includes the one surface rough region 25 in the one surface 20a, and also the side surface rough regions 26 and 27 in the side surfaces 20c, 20d, and 20f. Accordingly, separation of the mold resin 60 from the side surfaces 20c, 20d, and 20f of the terminal portion 20 can be reduced.

Moreover, the voids 72 are formed between the adjoining metal particles 70. The mold resin 60 is also introduced into the voids 72. In this case, adhesiveness between the mold resin 60 and the mounting portion 10 and the terminal portion 20 improves in comparison with a configuration not including the voids 72. Accordingly, separation of the mold resin 60 is further reduced, and hence airtightness improves.

Second Embodiment

A second embodiment will be described. The present embodiment is similar to the first embodiment except that the wire region 24 of the terminal portion 20 also has a rough shape. Accordingly, the same explanation is not repeatedly presented herein.

Figure 11:
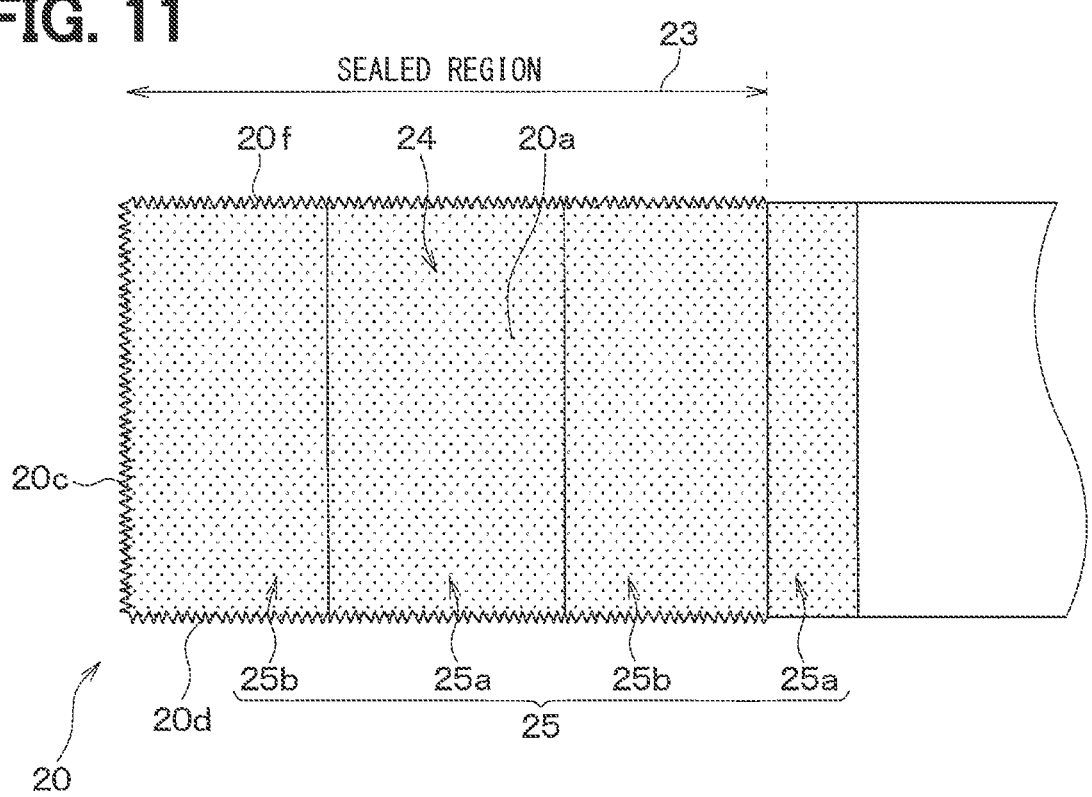
FIG. 11 is a diagram for explaining respective regions in one surface of a terminal portion in a second embodiment.

According to the present embodiment, the wire region 24 of the terminal portion 20 is provided with the first rough region 25a. The wire region 24 is located between the two second rough regions 25b as shown in FIG. 11. In other words, in the present embodiment, the one surface rough region 25 is provided in the entirety of the sealed region 23, on the one surface 20a of the terminal portion 20. A plurality of dots representing the rough shape are given to the one surface rough region 25 in FIG. 11 for easy understanding.

According to this configuration, the wire region 24 also has a rough shape around the region to which the bonding wire 50 is actually connected. Accordingly, adhesiveness between the wire region 24 and the mold resin 60 can improve.

Moreover, wire bonding is performed for the wire region 24 by applying ultrasonic vibrations to the wire region 24 in a state that a wire is pressed against the wire region 24, for example. The present inventors herein have found that bondability during wire bonding does not drop when a height difference between protrusions and recesses of the rough shape is 300 nm or smaller. The first rough region 25a is made of the minute protrusion and recess portion 71 having a maximum height of 300 nm or smaller. Accordingly, in the present embodiment, adhesiveness to the mold resin 60 further improves while suppressing a drop of bondability to the bonding wire 50.

When the wire region 24 has the first rough region 25a as described above, the metal particles 70 floating from the second rough region 25b are caused to be deposited on the wire region 24. In other words, the metal particles 70 are caused to float from the second rough region 25b to be deposited on the wire region 24.

While not particularly shown in the figures, the second rough region 25b is positioned adjacent to the wire region 24 in the present embodiment. Accordingly, each of the lateral side surfaces 20d and 20f is also formed with the lateral side surface rough region 27 in a region connecting to the wire region 24 of the one surface 20a.

Third Embodiment

A third embodiment will be described. The present embodiment is similar to the first embodiment except that the terminal portion 20 does not have the second rough region 25b. Accordingly, the same explanation is not repeatedly presented herein.

Figure 12:
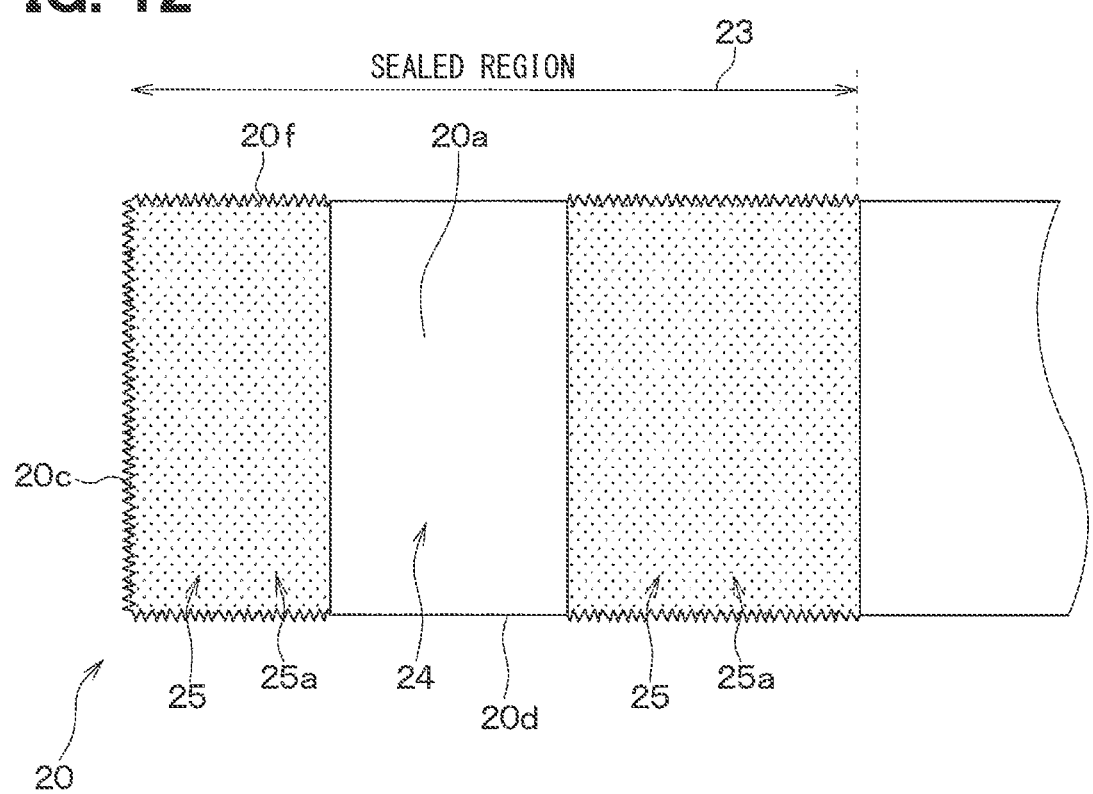
FIG. 12 is a diagram for explaining respective regions on one surface of a terminal portion in a third embodiment.

According to the present embodiment, in the sealed region 23 of the one surface 20a of the terminal portion 20, as shown in FIG. 12, a region different from the wire region 24 corresponds to the first rough region 25a. The sealed region 23 of the one surface 20a does not have the second rough region 25b. While not particularly shown in the figures, the entirety of the front side surface 20c corresponds to the front side surface rough region 26. Similarly, the entire region constituting the sealed region 23 in each of the lateral side surfaces 20d and 20f corresponds to the lateral side surface rough region 27.

While not particularly shown in the figures, an entire region different from the mounting region 14 in the sealed region 23 of the one surface 10a of the mounting portion 10 corresponds to the first rough region 15a. The sealed region 23 on the one surface 10a of the mounting portion 10 does not have the second rough region 25b. While not particularly shown in the figures, the entire region of each of the side surfaces 10c to 10f corresponds to the side surface rough region 16.

A method for manufacturing the terminal portion 20 configured as described above will be next described. This description is also applicable to a method for manufacturing the mounting portion 10.

Figure 13:
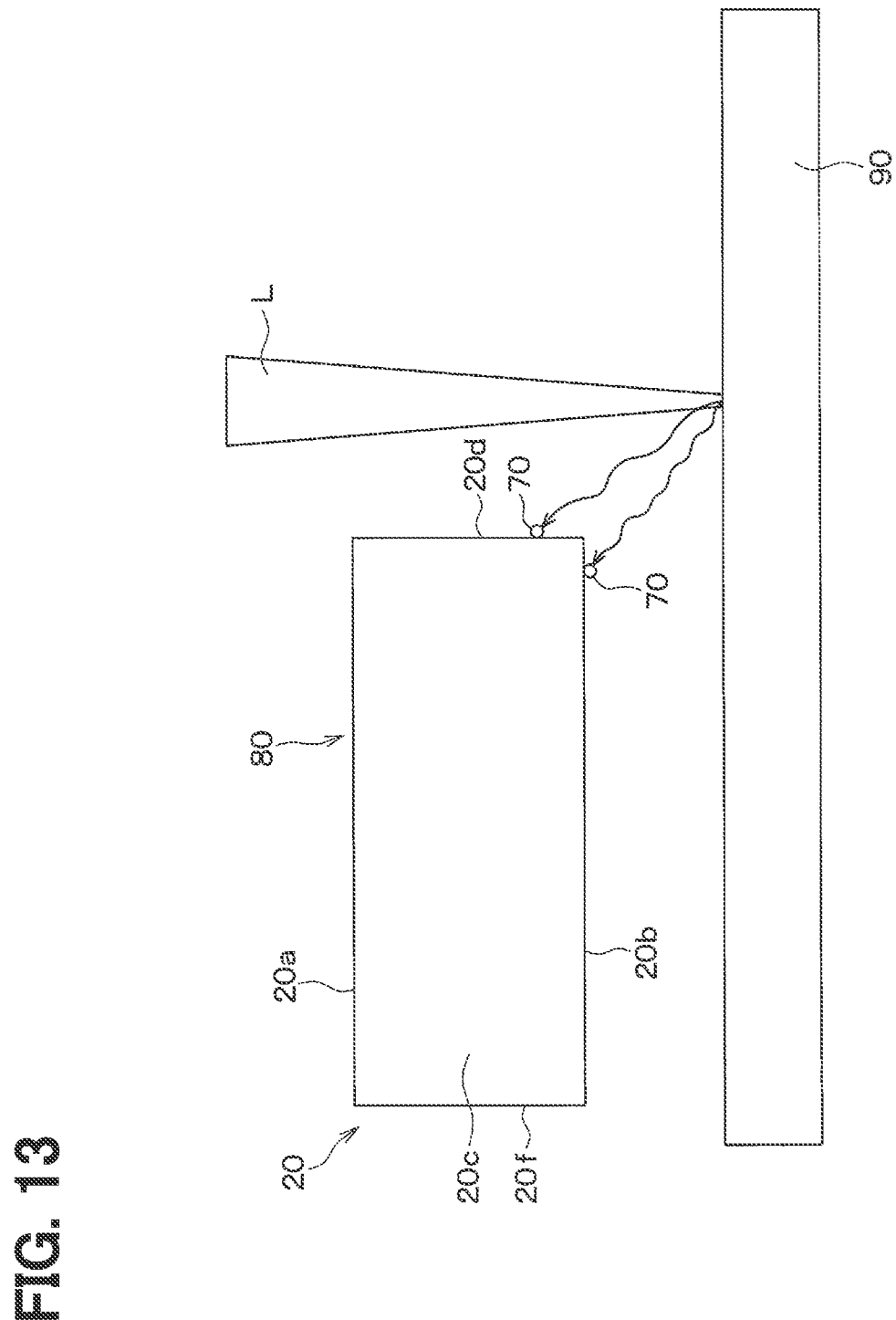
FIG. 13 is a diagram showing a manufacturing step for forming the terminal portion shown in FIG. 12.

According to the present embodiment, a lead frame 80 which includes the mounting portion 10 and the terminal portion 20 integral with each other through a tie bar, an outer peripheral frame, or the like is initially prepared as shown in FIG. 13. Further, a not-shown mask is disposed on the wire region 24 of the mounting portion 10. Thereafter, a target member 90 is disposed in the vicinity of a region of the terminal portion 20 where the metal particles 70 are to be stacked. In the present embodiment, the target member 90 is made of Ni.

Next, the laser light L is applied to the target member 90, so that the metal particles 70 are floated from the target member 90 and deposited and stacked on the terminal portion 20. As a result, the metal particles 70 are stacked on the terminal portion 20 to form the first rough region 25a. Thereafter, the mask provided on the wire region 24 is removed. In this manner, the first rough region 25a is formed in a region different from the wire region 24 on the one surface 20a of the terminal portion 20.

The front side surface rough region 26 and the lateral side surface rough region 27 are formed in the side surfaces 20c, 20d, and 20f of the terminal portion 20. In this case, the metal particles 70 can be stacked at desired positions of the side surfaces 20c, 20d and 20f by moving the target member 90, for example. Namely, in the present embodiment, the target member 90 is moved, for example, to stack the metal particles 70 on the entire regions of the side surfaces 20c, 20d, and 20f to form rough shapes thereon.

When the laser light L is applied to the target member 90 under conditions of energy density of 10 J/cm$^2$ and a pulse width of 1 μm second or shorter, for example, the metal particles 70 float from the target member 90 by approximately 0.25 mm. Accordingly, the metal particles 70 can be deposited from the target member 90 to the terminal portion 20 and stacked on the terminal portion 20 by setting a clearance between the target member 90 and the terminal portion 20 to 0.25 mm or smaller.

The floating distance of the metal particles 70 from the target member 90 increases with an increase in the energy density or the like of the laser light L applied to the target member 90. Accordingly, the energy density of the laser light L and the clearance between the target member 90 and the terminal portion 20 may be appropriately varied as long as the metal particles 70 can be deposited from the target member 90 to the terminal portion 20. However, if the energy density of the laser light L is excessively increased, the metal particles may scatter from the target member 90 as described above. Accordingly, the energy density of the laser light L is preferably set to 300 J/cm$^2$ or lower.

While not particularly shown in the figures, also in the mounting portion 10, the metal particles 70 are floated from the target member 90 and deposited on the mounting portion 10. In the mounting portion 10, for example, deposition of the metal particles 70 on the mounting region 14 may be eliminated by providing a mask on the mounting region 14, depositing the metal particles 70, and then removing the mask.

According to the present embodiment described above, the metal particles 70 are floated from the target member 90 to produce the rough shape. Therefore, the rough shape can be formed at a desired position. For example, the rough shape can be formed also in a region adjacent to the opposite surface 20b in each of the side surfaces 20c, 20d, and 20f of the terminal portion 20. Accordingly, adhesiveness to the mold resin 60 further improves.

According to the example described above, the entire region of the front side surface 20c of the terminal portion 20 corresponds to the front side surface rough region 26, and the entire region constituting the sealed region 23 in each of the lateral side surfaces 20d and 20f corresponds to the lateral side surface rough region 27. In the terminal portion 20, however, the front side surface rough region 26 may be formed in the front side surface 20c only in a region adjacent to the one surface 20a, and the lateral side surface rough region 27 may be formed on the sealed region 23 of each of the lateral side surfaces 20d and 20f only in a region adjacent to the one surface 20a. Namely, in the present embodiment, since the rough shape is produced by floating the metal particles 70 from the target member 90, the rough shape can be formed at a desired position. Accordingly, a range of forming the rough shape can be appropriately varied.

(Modification of Third Embodiment)

Figure 14:
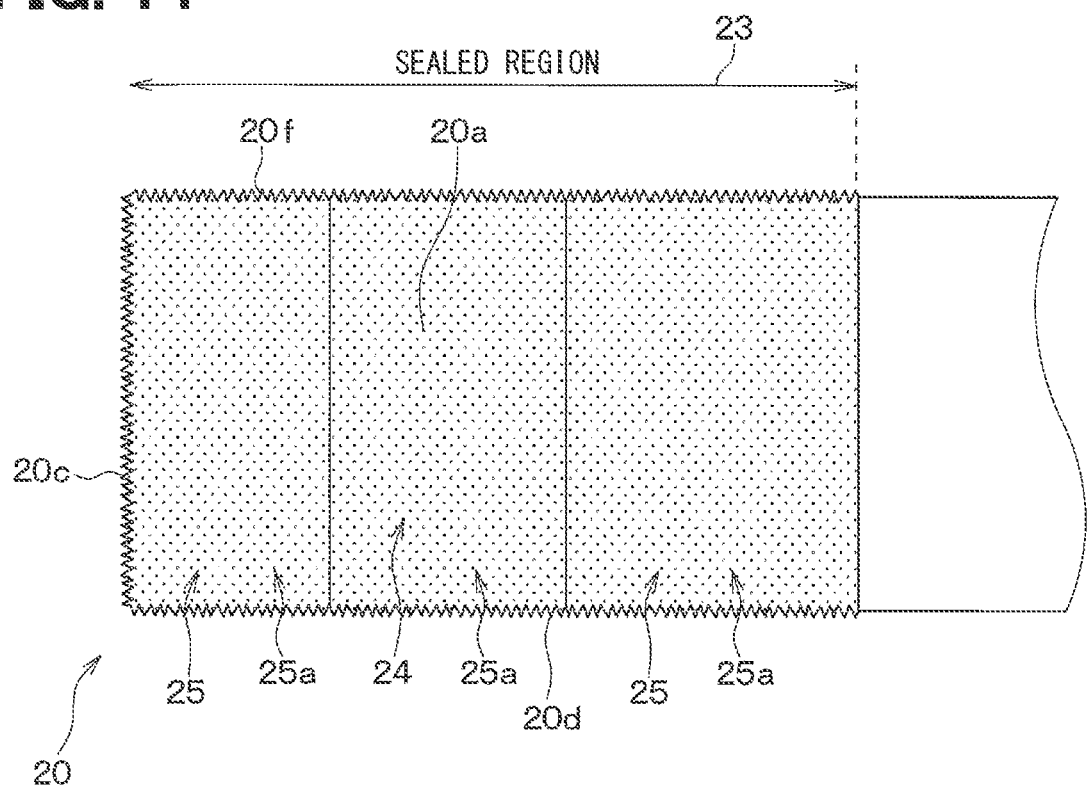
FIG. 14 is a diagram for explaining respective regions on one surface of a terminal portion in a modification of the third embodiment.

A modification of the third embodiment will be described. In the third embodiment, the wire region 24 may be also formed with the first rough region 25a without providing a mask on the wire region 24 of the terminal portion 20 as shown in FIG. 14. In other words, the entirety of the sealed region 23 on the one surface 20a of the terminal portion 20 may be provided with the first rough region 25a. Also in this configuration, since the first rough region 25a is made of the minute protrusion and recess portions 71 having the maximum height of 300 nm or smaller, a drop of bondability to the bonding wire 50 can be suppressed while improving adhesiveness to the mold resin 60.

Fourth Embodiment

A fourth embodiment will be described. The present embodiment is similar to the third embodiment except that the stacked state of the metal particles 70 is different. Accordingly, the same explanation is not repeatedly presented herein.

According to the present embodiment, the terminal portion 20 is made of the main metal portion 21 made of Al or an Al alloy, and is not provided with the metal thin film 22. In the present embodiment, the first rough region 25a has a rough shape which includes the minute protruded and recessed portion 71 produced by stacking the metal particles 70 made of an Al oxide. The terminal portion 20 in the present embodiment does not have the metal thin film 22, and thus each of the surfaces 20a to 20f is provided by the main metal portion 21.

Figure 15:
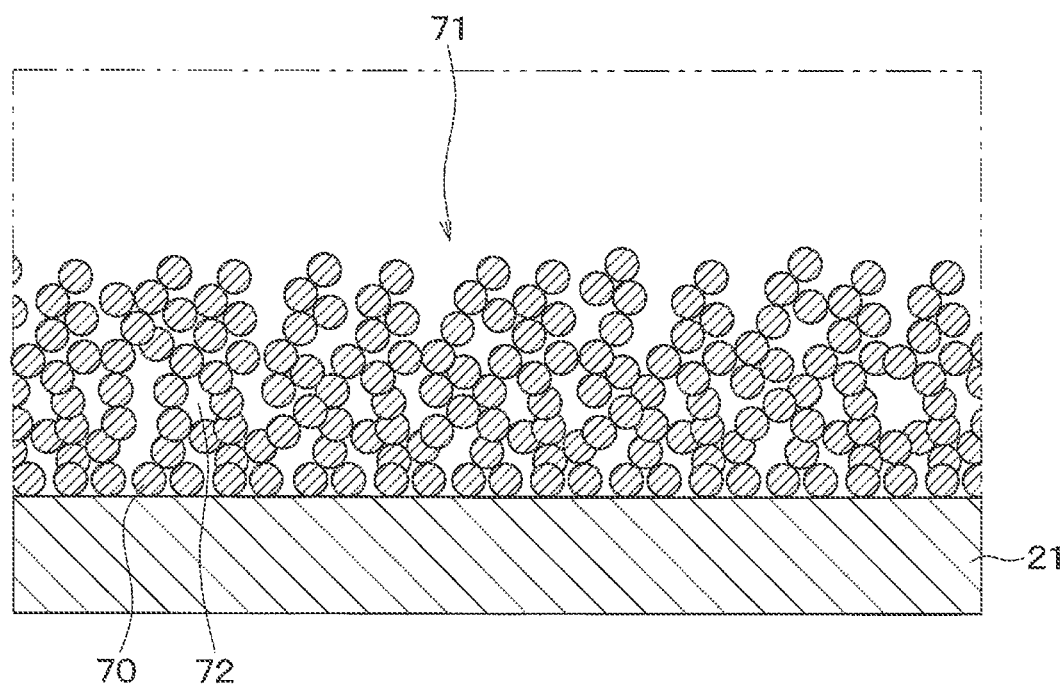
FIG. 15 is a schematic diagram showing a stacked state of metal particles in a fourth embodiment, and showing an enlarged view of a portion corresponding to the region IV in FIG. 3.

As shown in FIG. 15, the minute protrusion and recess portion 71 in the present embodiment is made of the plurality of metal particles 70 stacked on one another. Further, the plurality of metal particles 70 are substantially arranged in layers. Namely, in the present embodiment, the plurality of metal particles 70 are more regularly arranged than the metal particles 70 described with reference to FIG. 4. The minute protrusion and recess portion 71 of the present embodiment is provided by a rough shape caused by arrangement of the metal particle 70 located on the side opposite to the metal thin film 22. According to the present embodiment, it is also assumed that the minute protrusion and recess portion 71 has a maximum height of 300 nm or smaller.

The minute protrusion and recess portion 71 has the voids 72 between the adjoining metal particles 70. Each of the voids 72 has a size sufficient for introducing molten resin forming the mold resin 60 similarly to the first embodiment. The mold resin 60 is introduced into the voids 72.

The second rough region 25b has a rough shape that is provided by the minute protrusion and recess portion 71 having the substantially layered shape described above formed at the upper part of the metal thin film 22 including the upper parts of the grooves 73. Each of the front side surface rough region 26 and the lateral side surface rough region 27 has a rough shape which includes the above-described minute protrusion and recess portion 71 having the substantially layered shape, similarly to the first rough region 25a.

Similarly, the mounting portion 10 is provided by the main metal portion 11 made of Al or an Al alloy, and does not have the metal thin film 12. The first rough region 15a has a configuration similar to the first rough region 25a of the terminal portion 20, and has a rough shape which includes the above-described minute protrusion and recess portion 71 having the substantially layered shape. The second rough region 15b has a rough shape which includes the minute protrusion and recess portion 71 having the substantially layered shape and formed at the upper part of the metal thin film 12 including the upper parts of the grooves 73. The side surface rough region 16 has a rough shape which includes the above-described minute protrusion and recess portion 71 having the substantially layered shape, similarly to the first rough region 25a. The mounting portion 10 of the present embodiment does not have the metal thin film 12. Accordingly, each of the surfaces 10a to 10f is provided by the main metal portion 11.

The rough shape described above is formed by applying the laser light L under conditions similar to those of the first embodiment. A clear principle is not revealed also in this point. However, the followings are estimated. Al or an Al alloy has a melting point lower than that of Ni. In this case, when each of the main metal portions 11 and 21 is made of Al or Al alloy and receives the laser light L, the floating metal particles 70 obtain higher energy than in a case where each of the metal thin films 12 and 22 is made of an Ni plating film and receives the laser light L. Therefore, it is estimated that energy loss until fixation of the metal particles 70 after deposition of the floating metal particles 70 increases, and achieves regular arrangement of the metal particles 70 after deposition of the metal particles 70 when the laser light L is applied under the conditions similar to those of the first embodiment.

As described above, the rough shape may be provided by the metal particles 70 that are stacked in a substantially layered shape. An occupation rate of the voids 72 in this rough shape is larger than the corresponding rate of the rough shape of the first embodiment. In this case, a larger amount of the mold resin 60 can be introduced into the voids 72. Accordingly, adhesiveness between the mold resin 60 and the mounting portion 10 and the terminal portion 20 can further improve.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, in each of the above embodiments, a filler such as alumina and silica for controlling a linear expansion coefficient may be mixed in the epoxy resin of the mold resin 60.

In each of the above embodiments, in a case where the bonding wire 50 is provided by an Au wire or a Cu wire, the metal thin film 22 may include an Ag plating film laminated on the plating film to improve bondability to the bonding wire 50. In other words, a bonding plating film having high bondability to the material forming the bonding wire 50 may be laminated. In this case, the metal particles 70 are stacked on the bonding plating film to form a rough shape.

In the third embodiment, the target member 90 may be made of a metal material different from the material of the metal thin film 22, and may be made of Fe, Al, or Sn (tin), for example. Even when the target member 90 thus configured is used, the metal particles 70 can be stacked at desired positions of the mounting portion 10 and the terminal portion 20 to form rough shapes. In other words, in the third embodiment, the target member 90 may be made of a material different from the material of the metal thin film 22. Accordingly, the degree of freedom in design can improve. In other words, in the third embodiment, the metal particles 70 to be stacked can be appropriately changed in accordance with purposes of use, and hence the degree of freedom in design can improve. For example, when the target member 90 is made of Al or an Al alloy in the third embodiment, the plurality of metal particles 70 are arranged and stacked in a substantially layered shape, similarly to the fourth embodiment, by applying the laser light L under conditions similar to the conditions of the third embodiment.

In the third embodiment, a flexible substrate made of resin may be used as the base material, and the metal particles 70 may be stacked on a desired region of the flexible substrate to form a rough shape.

In the first, second, and fourth embodiments, irradiation other than the laser light L may be adopted as long as the metal particles 70 are floated, and the floated metal particles 70 are deposited and stacked, with the grooves 73 formed. For example, collision between the metal particles may be caused by applying a principle of sputtering. Similarly, also in the third embodiment, the metal particles 70 may be floated from the target member 90 by collision between the metal particles and the target member 90.

What is claimed is:

1. A base material comprising:
one surface; and
a side surface continuous with the one surface, wherein
each of the one surface and the side surface has a sealed region to be sealed with a mold resin,
the one surface includes a one surface rough region that has a rough shape in the sealed region,
the side surface includes a side surface rough region that has a rough shape in the sealed region,
each of the one surface rough region and the side surface rough region is provided by a plurality of metal particles stacked on one another,
the one surface includes a connection region to be connected to a connection member in the sealed region,
the one surface rough region is provided in a region different from the connection region,
the one surface rough region includes a first rough region disposed adjacent to the connection region, and a second rough region disposed on a side opposite to the connection region with respect to the first rough region,
the first rough region is provided by the plurality of metal particles stacked on one another, and
the second rough region is formed with a groove and is provided by the plurality of metal particles stacked in a region including the groove, and a height difference between protrusions and recesses of the second rough region is greater than that of the first rough region.

2. A base material comprising:
one surface; and
a side surface continuous with the one surface, wherein
each of the one surface and the side surface has a sealed region to be sealed with a mold resin,
the one surface includes a one surface rough region that has a rough shape in the sealed region,
the side surface includes a side surface rough region that has a rough shape in the sealed region,
each of the one surface rough region and the side surface rough region is provided by a plurality of metal particles stacked on one another,
the one surface has a connection region to be connected to a connection member in the sealed region,
the one surface rough region includes a first rough region disposed in a region including the connection region, and a second rough region disposed in a region different from the first rough region,
the first rough region is provided by the plurality of metal particles stacked on one another, and
the second rough region is formed with a groove and is provided by the plurality of metal particles stacked in a region including the groove, and a height difference between protrusions and recesses of the second rough region is greater than that of the first rough region.

3. The base material according to claim 1, wherein
the plurality of metal particles are stacked in a state where voids are formed between the adjacent metal particles, and
the voids are connected with each other and communicated with a space defined outside a region where the metal particles are stacked.

4. The base material according to claim 1, wherein
the plurality of metal particles are stacked to have a maximum height of 300 nm or smaller.

5. The base material according to claim 1, wherein
the side surface rough region is disposed to include a region of the side surface continuous with the second rough region.

6. A mold package in which a mounting portion and a terminal portion are both sealed with a mold resin, the mold package comprising:
the mounting portion having one surface, and a side surface continuous with the one surface;
the terminal portion having one surface and a side surface continuous with the one surface;
a semiconductor chip mounted on the one surface of the mounting portion;
a connection member electrically connecting the semiconductor chip and the terminal portion; and
the mold resin sealing the one surface and the side surface of the mounting portion, and the one surface and the side surface of the terminal portion while sealing the semiconductor chip and the connection member, wherein
each of the mounting portion and the terminal portion includes a one surface rough region having a rough shape in a sealed region of the one surface sealed with the mold resin, and a side surface rough region having a rough shape in a sealed region of the side surface sealed with the mold resin, each of the one surface rough region and the side surface rough region is provided by a plurality of metal particles stacked on one another, the one surface includes a connection region to be connected to a connection member in the sealed region, the one surface rough region is provided in a region different from the connection region, the one surface rough region includes a first rough region disposed adjacent to the connection region, and a second rough region disposed on a side opposite to the connection region with respect to the first rough region, the first rough region is provided by the plurality of metal particles stacked on one another, and the second rough region is formed with a groove and is provided by the plurality of metal particles stacked in a region including the groove, and a height difference between protrusions and recesses of the second rough region is greater than that of the first rough region.

7. A mold package in which a mounting portion and a terminal portion are both sealed with mold resin, the mold package comprising:

the mounting portion having one surface, and a side surface continuous with the one surface;

the terminal portion having one surface and a side surface continuous with the one surface;

a semiconductor chip mounted on the one surface of the mounting portion;

a connection member electrically connecting the semiconductor chip and the terminal portion; and the mold resin sealing the one surface and the side surface of the mounting portion, and the one surface and the side surface of the terminal portion while sealing the semiconductor chip and the connection member, wherein each of the mounting portion and the terminal portion includes a one surface rough region having a rough shape in a sealed region of the one surface sealed with the mold resin, and a side surface rough region having a rough shape in a sealed region of the side surface sealed with the mold resin, each of the one surface rough region and the side surface rough region is provided by a plurality of metal particles stacked on one another, the one surface has a connection region to be connected to a connection member in the sealed region, the one surface rough region includes a first rough region disposed in a region including the connection region, and a second rough region disposed in a region different from the first rough region, the first rough region is provided by the plurality of metal particles stacked on one another, and the second rough region is formed with a groove and is provided by the plurality of metal particles stacked in a region including the groove, and a height difference between protrusions and recesses of the second rough region is greater than that of the first rough region.

8. The mold package according to claim 6, wherein the plurality of metal particles are stacked in a state where voids are formed between the adjacent metal particles, and the mold resin is introduced in the voids.

9. A method for manufacturing a base material that has one surface, and a side surface continuous with the one surface, and in which each of the one surface and the side surface has a sealed region to be sealed with a mold resin, the method comprising:

preparing a base member that includes the one surface and the side surface, and is made of a metal material;

forming a one surface rough region having a rough shape in the sealed region of the one surface; and forming a side surface rough region having a rough shape in the sealed region of the side surface, wherein in the forming of the one surface rough region and in the forming of the side surface rough region, metal particles are floated by forming a groove in the one surface, and the floated metal particles are deposited and stacked on the groove and a periphery of the groove on the one surface, and also deposited and stacked on the side surface, to thereby form the one surface rough region and the side surface rough region.

10. The method for manufacturing the base material, according to claim 9, wherein in the preparing of the base member, the base member having a connection region to be connected to a connection member in the one surface is prepared, and in the forming of the one surface rough region, the groove is formed in a region of the one surface different from the connection region, and the metal particles are deposited and stacked in the region different from the connection region.

11. The method for manufacturing the base material, according to claim 9, wherein in the preparing of the base member, the base material having a connection region to be connected to a connection member in the one surface is prepared, and in the forming of the one surface rough region, the groove is formed in a region of the connection region different from the connection region, and the metal particles are deposited and stacked in a region including the connection region.

12. A method for manufacturing a base material that has one surface, and a side surface continuous with the one surface, and in which each of the one surface and the side surface has a sealed region to be sealed with a mold resin, the method comprising:

preparing a base member that has the one surface and the side surface;

forming a one surface rough region that has a rough shape in the sealed region of the one surface; and forming a side surface rough region that has a rough shape in the sealed region of the side surface, wherein in the forming of the one surface rough region and the forming of the side surface rough region, a target member made of a metal material is prepared, and the one surface rough region and the side surface rough region are formed by floating metal particles from the target member, and depositing and stacking the floated metal particles on the one surface and the side surface.

13. The method for manufacturing the base material, according to claim 12, wherein in the preparing of the base member, the base material having a connection region to be connected to a connection member in the one surface is prepared, and in the forming of the one surface rough region, the metal particles are deposited and stacked on a region including the connection region of the one surface.

14. The method for manufacturing the base material, according to claim 9, wherein in depositing and stacking the metal particles, the metal particles are stacked such that voids are formed between adjacent metal particles and are connect to each other between the adjacent metal particles, and re communicated with a space outside a region where the metal particles are stacked.

15. A method for manufacturing a mold package that includes a base material sealed with a mold resin, the method comprising:
preparing the base material manufactured by the method according to claim 14; and
forming the mold resin such that one surface and a side surface of the base material are sealed, wherein
in the forming of the mold resin, the mold resin is introduced into the voids.

* * * * *